(12) United States Patent
Rinner et al.

(10) Patent No.: US 10,164,167 B2
(45) Date of Patent: Dec. 25, 2018

(54) METHOD FOR PRODUCING AN ELECTRIC COMPONENT AND ELECTRIC COMPONENT

(71) Applicant: EPCOS AG, Munich (DE)

(72) Inventors: Franz Rinner, Deutschlandsberg (AT); Dieter Somitsch, Gross St. Florian (AT)

(73) Assignee: EPCOS AG, Munich (DE)

( * ) Notice: Subject to any disclaimer, the term of this patent is extended or adjusted under 35 U.S.C. 154(b) by 825 days.

(21) Appl. No.: 14/409,458

(22) PCT Filed: May 16, 2013

(86) PCT No.: PCT/EP2013/060182
§ 371 (c)(1),
(2) Date: Dec. 18, 2014

(87) PCT Pub. No.: WO2013/189671
PCT Pub. Date: Dec. 27, 2013

(65) Prior Publication Data
US 2015/0325781 A1    Nov. 12, 2015

(30) Foreign Application Priority Data
Jun. 18, 2012 (DE) .......... 10 2012 105 287

(51) Int. Cl.
*H01L 41/08* (2006.01)
*H01L 41/273* (2013.01)
(Continued)

(52) U.S. Cl.
CPC ............ *H01L 41/273* (2013.01); *H01C 7/10* (2013.01); *H01C 7/18* (2013.01); *H01G 4/232* (2013.01);
(Continued)

(58) Field of Classification Search
CPC ................. H01C 7/02; H01L 41/273
See application file for complete search history.

(56) References Cited

U.S. PATENT DOCUMENTS 5,254,212 A * 10/1993 Someji ................. H01L 41/293
216/20
5,853,514 A * 12/1998 Takeuchi .............. C04B 35/486
156/89.12

(Continued)

FOREIGN PATENT DOCUMENTS

DE         441504 A1    9/1994
DE   102006001656 A1   2/2007
(Continued)

OTHER PUBLICATIONS

Polyimide—Wikipedia: <http://de.wikipedia.org/wiki/Polyimid> (English counterpart—<http://en.wikipedia.org/w/index.php?title=Polyimide&printable=yes>).

*Primary Examiner* — Thomas Dougherty
*Assistant Examiner* — Karen B Addison
(74) *Attorney, Agent, or Firm* — Morgan, Lewis & Bockius LLP

(57) ABSTRACT

A method for producing an electric component (19) is specified, wherein in a step A) a body (1) having at least one cavity (7, 8) is provided. In a step B), the cavity (7, 8) is at least partly filled with a liquid insulation material (13) by means of capillary forces. Furthermore, an electric component (19) is specified wherein a cavity (7, 8) is at least partly filled with an insulation material (13). The insulation material (13) is introduced into the cavity (7, 8) by means of capillary forces. Furthermore, an electric component (19) is specified wherein a cavity (7, 8) is at least partly filled with an organic insulation material (13) and wherein the cavity is at least partly covered by a fired external contacting (17, 18).

14 Claims, 3 Drawing Sheets

Figure 1:
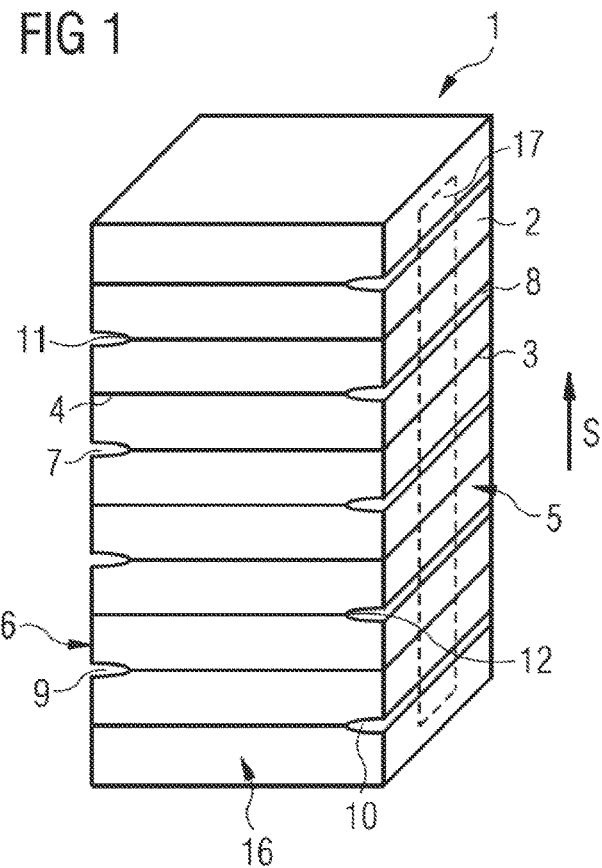

(51) Int. Cl.
*H01L 41/083* (2006.01)
*H01G 4/232* (2006.01)
*H01L 41/293* (2013.01)
*H01G 4/30* (2006.01)
*H01C 7/10* (2006.01)
*H01C 7/18* (2006.01)
*H01C 7/02* (2006.01)
*H01C 7/04* (2006.01)

(52) U.S. Cl.
CPC ............. *H01G 4/30* (2013.01); *H01L 41/083* (2013.01); *H01L 41/0838* (2013.01); *H01L 41/293* (2013.01); *H01C 7/02* (2013.01); *H01C 7/04* (2013.01); *Y10T 29/43* (2015.01)

(56) References Cited

U.S. PATENT DOCUMENTS 6,217,979 B1 * 4/2001 Takeuchi .............. C04B 35/486
                                                    310/324

| | | | |
|---|---|---|---|
| 2005/0168106 | A1 | 8/2005 | Iwase et al. |
| 2009/0320255 | A1 | 12/2009 | Ganster et al. |
| 2010/0282874 | A1 * | 11/2010 | Nakamura .......... H01L 41/0471 239/585.1 |

FOREIGN PATENT DOCUMENTS

| | | |
|---|---|---|
| DE | 102007004813 A1 | 8/2008 |
| DE | 102008042232 A1 | 4/2009 |
| EP | 1942533 A1 | 7/2008 |
| JP | H03280481 B2 | 12/1991 |
| JP | H05267743 B1 | 10/1993 |
| JP | H06283371 A | 10/1994 |
| JP | 2004095593 A | 3/2004 |
| JP | 2004-119856 A | 4/2004 |
| JP | 2005223013 A | 8/2005 |
| JP | 2009076760 A | 4/2009 |
| JP | 2010517311 A | 5/2010 |
| WO | WO-2007049697 A1 | 5/2007 |
| WO | 2011/154352 A1 | 12/2011 |

* cited by examiner

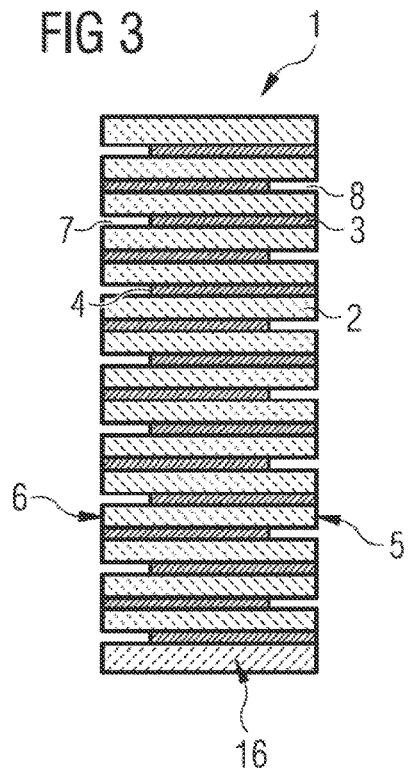
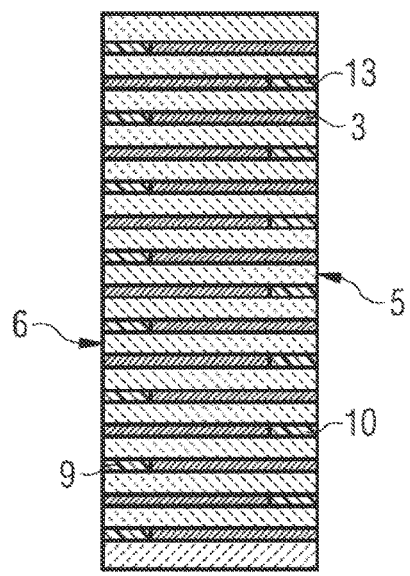
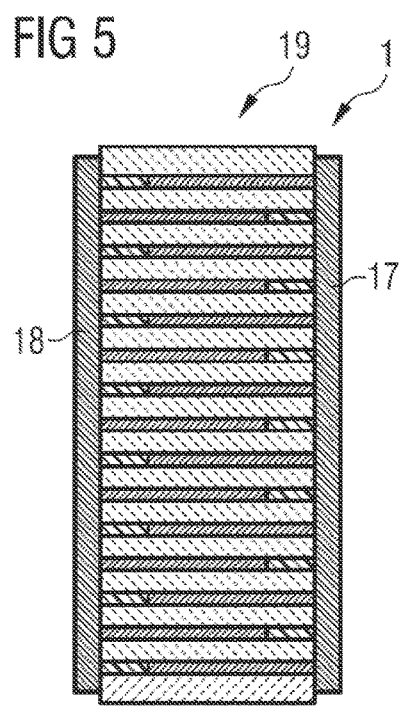

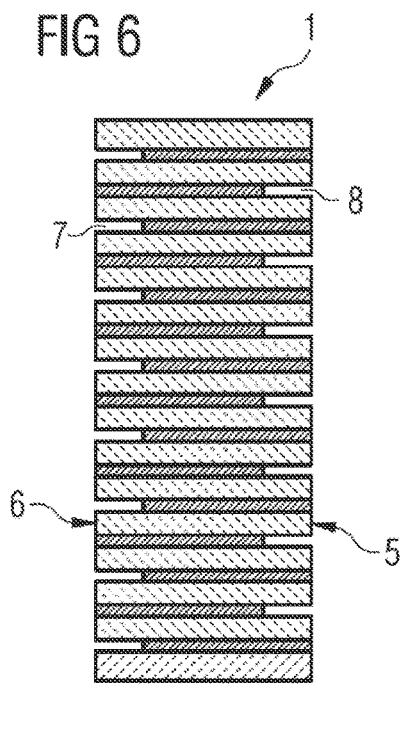
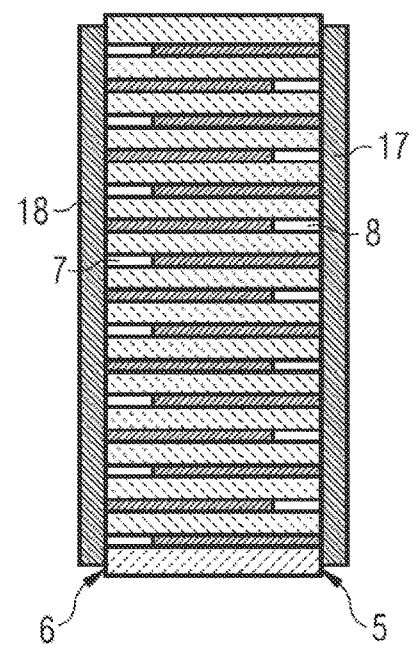
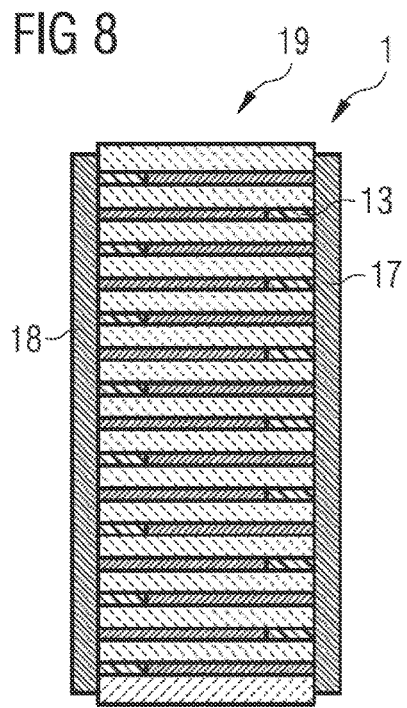

METHOD FOR PRODUCING AN ELECTRIC COMPONENT AND ELECTRIC COMPONENT

A method for producing an electric component and an electric component are specified. The component is preferably a multilayer component. By way of example, the component is embodied as a piezoactuator which can be used for actuating an injection valve in a motor vehicle. The component can for example also be embodied as a varistor, capacitor, NTC thermistor or PTC thermistor.

The documents DE 10 2006 001 656 A1, DE 44 10 504 B4 and DE 10 2007 004 813 A1 describe etching methods for forming insulation zones in multilayer components. The insulation zones are subsequently filled with an insulation material.

One object to be achieved is to specify an improved method for producing an electric component and an electric component having improved properties.

A method for producing an electric component is specified, wherein a body having at least one cavity is provided. The cavity is at least partly filled with an insulation material by means of capillary forces. By way of example, for this purpose, the body is introduced at least partly into a liquid insulation material. The body preferably has a multiplicity of cavities which are filled with the insulation material.

The body is embodied for example as a main body for the electric component. Alternatively, after the process of filling with the insulation material, the body can be separated into a plurality of main bodies for electric components. The component is preferably a piezoelectric component, in particular the component can be embodied as a piezoactuator.

Preferably, the body has electrode layers. Preferably, the electrode layers are arranged in a manner alternating with dielectric layers to form a stack. The dielectric layers are for example ceramic layers, in particular piezoceramic layers. The body is preferably a monolithic sintering body.

Preferably, a voltage is applied between adjacent electrode layers during operation of the component. The electrode layers preferably extend in the stacking direction alternately as far as a first side surface of the body and are spaced apart from a second side surface, preferably an opposite side surface. In particular, first electrode layers extend as far as the first side surface and are spaced apart from the second side surface. Second electrode layers extend as far as the second side surface and are spaced apart from the first side surface.

In one embodiment, the cavity adjoins an electrode layer. By way of example, the cavity produces the spacing between an electrode layer and a side surface. In this case, the cavity serves as an insulation zone in order to produce an electrical insulation of the electrode layer from the side surface. Preferably, the body has a multiplicity of cavities which insulate the first and second electrode layers alternately from side surfaces of the body.

In this way, the first electrode layers can be jointly electrically contacted by a first external contact-contacting, which is arranged on a first side surface of the body, while the second electrode layers are insulated from said external contacting. Likewise, the second electrode layers can be jointly electrically contacted by a second external contacting, which is arranged on a second side surface of the stack, while the first electrode layers are insulated from said external contacting.

Alternatively or additionally, the cavity can produce a mechanical load relief for the body. Mechanical stresses can arise in the body particularly given the presence of inactive zones in the component. In inactive zones, no overlap of adjacent electrode layers occurs as viewed in the stacking direction. By way of example, inactive zones arise if adjacent electrode layers in the component are alternately led as far as a side surface and spaced apart from the opposite side surface.

Alternatively or additionally, the cavities can form predetermined breaking regions. A predetermined breaking region is preferably a weak point in the component which serves for producing and guiding cracks in a targeted manner. In this way, it is possible to prevent uncontrolled arising and propagation of cracks in the component with the result that the risk of short circuits is reduced.

In one embodiment, the cavity does not adjoin an electrode layer. In this case, the cavity serves for example only as a predetermined breaking region or for reducing stresses in the body.

The cavity is introduced into the body for example by means of an etching method. For this purpose, the body is produced for example with electrode layers applied over the whole area. The body is introduced into an etching medium and a voltage is applied between the first or second electrode layers and a separate auxiliary electrode. In this way, it is possible to carry out an electrically controlled etching method wherein cavities are introduced into the body in a controlled manner. Particularly narrow cavities that are difficult to fill can be produced by an etching method.

Alternatively, the cavity can also be introduced into the body by a different method. By way of example, the cavity is introduced into the body by a mechanical method.

The cavity is at least partly filled with insulation material. This is intended to prevent, in particular, an electric breakdown between an electrode layer and an external electrode having a different polarity than the electrode layer. When a voltage is applied to the electrode layers via external electrodes applied to the said surfaces, such an undesired electric breakdown can occur. This problem arises owing to the fact that at one electrode end an excessive field increase can occur which can lead to an avalanche breakdown between the electrode end and the external electrode separated by the cavity. In particular, this occurs in the case of an external electrode to which a positive voltage is applied and an electrode layer acting as a cathode tip. Such a breakdown can lead to the disruption of the component. As an alternative or in addition thereto, the insulation material can prevent substances, in particular electrically conductive substances, from being introduced into the body and leading to a short circuit.

The introduction of insulation material into the cavities is intended to increase the electric breakdown voltage and thus to prevent a breakdown. Preferably, the insulation material is introduced between an exposed end of an electrode layer and the location of an external electrode. Consequently, the insulation material can form a barrier between the electrode layer and the external electrode and, in particular, prevent an avalanche breakdown which can lead to damage to the component.

By way of example, the insulation material covers at least one end of an electrode layer that is exposed in the cavity. Preferably, the insulation material covers all electrode layers exposed in the cavity. Alternatively or additionally, the insulation material can be present in a different region between an exposed electrode end and an external electrode. By way of example, the insulation material covers that side of the external electrode which faces the cavity.

In one embodiment, over the entire length of an electrode end, insulation material is present between the electrode end and the location of an external electrode. However, insulation material can also be present only on a partial length of the electrode end. This can be the case, in particular if the external electrode is applied only over a part of the outer side. The cavity is then preferably filled with insulation material in the region situated between the electrode end and the location of the external electrode. In one embodiment, the cavity is completely filled with the insulation material.

In one embodiment, for the purpose of filling the cavity with insulation material, the body is introduced at least partly into an insulation material, in particular a liquid insulation material.

By way of example, the body is introduced into the insulation material by a side surface at which the cavity is exposed. The insulation material is drawn into the cavity by capillary forces and preferably rises upward in the cavity by means of capillary forces. Preferably, the cavity is filled in accordance with its entire length as a result.

The cavity leads for example from one side surface as far as the opposite side surface and is exposed on both side surfaces. The body can then be introduced into the insulation material only by one of the side surfaces and the insulation material then migrates as far as the opposite side surface on account of capillary forces. If the insulation material rises from the bottom upward in the cavity, air can escape through the upper opening of the cavity. Preferably, the body is introduced into the insulation material by the side surface which is not provided for the arrangement of an external contacting. Alternatively, the cavity can also be filled with insulation material only over part of its length. By way of example, in this case, the insulation material does not rise right to the top.

Before the body is introduced into the insulation material, parts of the body can be covered, in particular clamped, such that these parts remain free of the insulation material.

In a further embodiment, the insulation material is applied to the body. In particular, the insulation material is applied to a side surface on which the cavities are exposed. The insulation material is then drawn into the cavities by capillary forces.

By way of example, in this case, the insulation material is applied at least to that region of a side surface on which an external electrode is arranged later. Preferably, the surface on which the insulation material is applied is larger than the surface on which the external electrode is arranged.

By way of example, the insulation material can be applied to the body by means of screen printing. This method is particularly well suited in the case of glass as insulation material. The glass can be liquefied by means of a firing process and then penetrates into the cavity on account of capillary forces. By way of example, the insulation material fills only a region of the cavity near the side surface and does not advance as far as the electrode ends.

The liquid insulation material is preferably chosen in such a way that it readily wets the material adjoining the cavity.

In one embodiment, the insulation material comprises a lacquer. By way of example, the insulation material comprises an organic material. In particular, an alcohol-based lacquer can be involved. Such a solvent makes it possible to achieve a good use of a ceramic material, in particular of PZT. The lacquer can also be used for the external passivation of the body. After being introduced into the cavities, the lacquer is cured.

In a further embodiment, the insulation material comprises glass. In this case, in the course of being introduced into the cavities, the glass is present above its melting point. By way of example, the glass comprises a lead or silicon basis. The melting point of the glass is preferably above the firing temperature of the external contacting. The glass has a sufficiently low viscosity, such that it can fill the cavities. Particularly in the case of glass as insulation material, it is possible still to carry out high-temperature processes even after the cavity has been filled. By way of example, after the insulation material has been introduced, the external contacting can be applied as metal paste and fired. Furthermore, glass has a particularly high electric breakdown strength. By way of example, the glass is applied as paste over the cavities and is liquefied in a firing process.

Preferably, an external contacting is applied to the body. In one embodiment, the external contacting is applied to the body before the introduction of insulation material, for example before the body is introduced into a liquid insulation material.

Preferably, the external contacting serves for making contact with electrode layers. By way of example, a first external contacting for making contact with the first electrode layers and a second external contacting for externally making contact with the second electrode layers are applied. By way of example, the external contacting is fired. In this case, the external contacting is preferably applied in the form of a metal paste to a side surface, for example in a screen printing method, and is subsequently fired.

Preferably, the external contacting at least partly covers the cavity. In particular, during a process of applying the external contacting before the cavity is filled with insulation material, a hollow space is present below the external contacting. The insulation material can then be introduced into the cavity situated below the external contacting by means of a capillary effect.

This has the advantage that the insulation material can be introduced in a controlled manner only into the cavity and, in particular, does not cover any electrode layers which extend as far as the side surface on this side surface. Further processing steps, such as e.g. polishing of a side surface, can thus be obviated.

Furthermore, during a process of applying the external contacting before the cavity is filled with the insulation material, process steps for applying the external contacting can be carried out without the risk of damage to the insulation material. By way of example, high-temperature processes, e.g. firing of an external contacting applied as metal paste, can be carried out. An insulation material which is not suitable for high-temperature processes, in particular an organic insulation material, can subsequently be introduced into the cavity.

In an alternative embodiment, the external contacting is applied to the body after the insulation material has been introduced. By way of example, the external contacting can be applied as metal paste to a side surface and be fired. Alternatively, the external contacting can also be applied by means of sputtering. Alternatively, the external contacting can be embodied as conductive adhesive.

Preferably, the body has a plurality of cavities. The cavities can be arranged at different side surfaces. By way of example, a first cavity is arranged at a first side surface and a second cavity is arranged at a second side surface. Preferably, the cavities arranged on the different side surfaces are filled with the insulation material in a single-stage method. In particular, the cavities are simultaneously filled with the insulation material. This obviates the need for a multi-stage introduction of insulation material, e.g. in a first step introduction of insulation material into the cavities arranged at the first side surface, and in a subsequent second step introduction of insulation material into the cavities arranged at the second side surface.

Furthermore, an electric component is specified which comprises a body having a cavity, wherein the cavity is at least partly filled with an organic insulation material. Preferably, the body forms a main body of the component. The cavity is at least partly covered by a fired external contacting.

Preferably, the fired external contacting is arranged on a side surface of the body. The external contacting serves for example for making contact with electrode layers.

The component can be produced by the method described here and can have all functional and structural features described with regard to the method.

By way of example, the organic insulation material can be introduced into the cavity by means of capillary forces as described in the method above. In this case, in particular, firstly the external contacting can be applied and fired. Subsequently, the organic insulation material can be introduced into the cavities below the fired external contacting. Afterward, the organic insulation material can be cured. The organic insulation material is an organic lacquer, for example.

Preferably, the body has at least one electrode layer. The organic insulation material is arranged for example between the electrode layer and the external contacting. The cavity with the organic insulation material can thus serve for electrically insulating electrode layers from an external contacting, as described above. Alternatively or additionally, the cavity can form a predetermined breaking point.

Furthermore, an electric component is specified which comprises a body having at least one cavity which is at least partly filled with an insulation material. Preferably, the body forms a main body of the component. The insulation material is introduced into the cavity by means of capillary forces.

The component can be produced by the method described here and can have all functional and structural features described with regard to the method.

The subjects described here are explained in greater detail below on the basis of schematic exemplary embodiments which are not true to scale.

Figure 2:
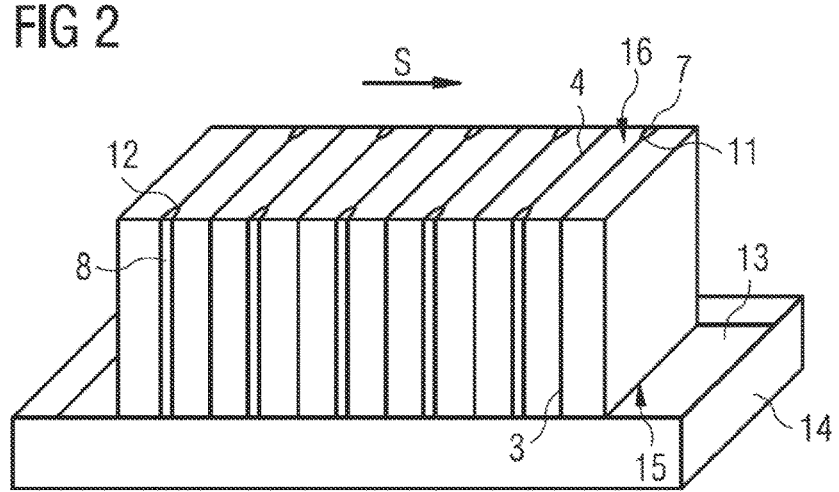

In the figures:

FIG. 1 shows a body for a multilayer component in a schematic perspective view,

FIG. 2 shows in schematic illustration the step of introducing insulation material into cavities of the body from FIG. 1, FIG. 3 shows a lateral plan view of the body from FIG. 1 before the introduction of insulation material in accordance with a first method sequence, FIG. 4 shows a lateral plan view of the body from FIG. 3 after the introduction of insulation material in accordance with the first method sequence, FIG. 5 shows a lateral plan view of the body from FIG. 4 after the application of external electrodes in accordance with the first method sequence, FIG. 6 shows a lateral plan view of the body from FIG. 1 before the introduction of insulation material in accordance with the second method sequence, FIG. 7 shows a lateral plan view of the body from FIG. 6 after the application of external contactings in accordance with the second method sequence, FIG. 8 shows a lateral plan view of the body from FIG. 7 after the introduction of insulation material in accordance with the second method sequence.

Preferably, in the following figures, identical reference signs refer to functionally or structurally corresponding parts of the different embodiments.

FIG. 1 shows a schematic perspective view of a body 1 for an electric component.

The body 1 has a stack composed of dielectric layers 2 and electrode layers 3, 4 arranged there between. The layers 2, 3, 4 are stacked one above another along a stacking direction S. The stacking direction S corresponds to the longitudinal axis of the body 1.

The body 1 depicted here is a main body for a component, for example for a piezoactuator. In a different embodiment, the body is separated into a plurality of main bodies in a later method step.

The dielectric layers 2 contain a ceramic material, for example. Preferably, the dielectric layers 2 are embodied as piezoelectric layers, in particular as piezoceramic layers.

The body 1 depicted is preferably a sintered body. Particularly preferably, the body 1 is a monolithic sintering body, such that the electrode layers 3, 4 are sintered jointly with the dielectric layers 2.

The electrode layers 3, 4 preferably contain a metal. Particularly preferably, the electrode layers 3, contain copper or consist of copper. In further embodiments, the electrode layers 3, 4 can contain silver or silver-palladium, for example.

The electrode layers 3, 4 comprise first electrode layers 3 and second electrode layers 4, which are arranged alternately one above another. The first electrode layers 3 extend as far as a first side surface 5 of the body 1 and are spaced apart from a second, opposite side surface 6. The second electrode layers 4 are spaced apart from the first side surface 5 of the body 1 and extend as far as the second, opposite side surface 6.

First and second cavities 7, 8 are formed in the body 1 in a manner adjoining the electrode layers 3, 4, by means of which cavities the electrode layers 3, 4 are set back alternately from the side surfaces 5, 6. The cavities 7, 8 extend for example 100 µm into the interior of the body 1.

The first and second cavities 7, 8 form first and second insulation zones 9, 10, which electrically insulate the electrode layers 3, 4 in each case from a side surface 5, 6. In this way, the first electrode layers 3 can be jointly contacted by an external electrode 17 applied to the first side surface 5, while the second electrode layers 4 are insulated from said external electrode 17. Accordingly, the second electrode layers 4 can be electrically contacted by an external electrode 18 applied to the second side surface 6 (see FIG. 5). The first external electrode 17 is depicted by dashed lines in order to illustrate one possible positioning and configuration of the external electrode 17. The external electrodes 17, 18 can be applied before or after the filling of the cavities 7, 8 with insulation material.

The cavities 7, 8 can additionally form predetermined breaking regions in which cracks arise and are guided in a targeted manner in the body 1. As a result, it is possible to prevent a crack from propagating in the body 1 in an uncontrolled manner and from leading to a short circuit in the event of bridging electrode layers 3, 4. Furthermore, the cavities 7, 8 can also lead to a mechanical load relief in the insulating zones 9, 10, such that fewer cracks arise in the body 1.

In a different embodiment, the cavities 7, 8 can be positioned in such a way that they do not adjoin electrode layers 3,4. In this case, the cavities 7, 8 can serve only for mechanical load relief or as predetermined breaking regions.

By way of example, the cavities 7, 8 are etched into the body 1. Such cavities 7, 8 have for example a slot width in the stacking direction of approximately 2 μm.

When a voltage is applied to the electrode layers 3, 4 via external contact-connections 17, 18 applied to the side surfaces 5, 6, an undesired electric breakdown can occur between an exposed electrode end 11, 12 and an external contact-connection 18, 17 which is not connected to the associated electrode layer 3, 4.

The introduction of insulation material into the cavities 7, 8 is intended to increase the electric breakdown voltage and thus to prevent a breakdown. By way of example, the insulation material is applied at least to the electrode ends 11, 12. The work function of electrons from the electrode ends 11, 12 can thus be increased. Alternatively or additionally, the insulation material can also be arranged at a different location between the external contacting 18, 17 and an electrode end 11, 12. By way of example, the insulation material can be introduced into the cavities 7, 8 in such a way that it covers the inner side of an external contacting 18, 17. An avalanche breakdown can be prevented in this way, too.

FIG. 2 shows in schematic illustration a method for introducing insulation material into the cavities of the body 1 from FIG. 1.

In this case, a liquid insulation material 13 in a container 14 is provided. The insulation material 13 preferably exhibits a good wetting on the dielectric material. In particular, the wetting angle of contact is embodied as shallow. In this case, the cavities can readily be filled by means of capillary forces. The insulation material 13 can additionally also be used for the external passivation of the body 1.

In one embodiment, the insulation material 13 comprises a lacquer. In particular, an organic insulation material 13 can be involved. By way of example a silicone lacquer comprising xylene and ethyl benzene as diluents is suitable.

In a further embodiment, the insulation material 13 comprises glass. In the course of being introduced into the cavities 7, 8, the glass is present above the melting point. By way of example, the glass comprises a lead or silicon basis.

The body 1 is partly introduced into the insulation material 13. In particular, it is introduced into the insulation material 13 by a third side surface 15. The cavities 7, 8 are exposed on the third side surface 15. Consequently, the insulation material 13 can simultaneously penetrate into the first and second cavities 7, 8. The insulation material 13 rises upward in the cavities 7, 8 by means of capillary forces. In this case, air can escape from the cavities 7, 8 upward. Preferably, the insulation material 13 rises up to an opposite fourth side surface 16. Consequently, the cavities 7, 8 are filled by the insulation material 13 over their entire length.

In this case, the insulation material 13 can completely fill the cavities 7, 8. Alternatively, the cavities 7, 8 can also be only partly filled with insulation material 13. In this case, for example, at least the electrode ends 11, 12 are covered by the insulation material 13 over their entire length. The breakdown voltage can be increased by such sealing of the electrode ends 11, 12, in particular of the cathode tips. Alternatively or additionally, the insulation material 13 can be present at a different location between the electrode ends 11, 12 and the location of the external electrodes 17, 18.

The insulation material 13 can also fill the cavities 7, 8 only over part of the length of the electrode ends 11, 12. In this case, the insulation material 13 is preferably present at least in a region between the electrode ends 11, 12 and the location of the external electrodes 17, 18.

The method carried out comprises a single stage, such that the body 1 is introduced into the insulation material 13 only once. Alternatively, the body 1 can also be introduced into the insulation material 13 a number of times. By way of example, after the introduction of the third side surface 15, said body is subsequently introduced into the insulation material 13 by its fourth side surface 16. This can be advantageous if the insulation material 13 does not rise completely upward in the course of the first introduction of the body 1 into the insulation material 13.

Filling the cavities 7, 8 using the capillary effect is advantageous particularly in the case of cavities having a small width, since the insulation material 13 can be introduced into the narrow cavity in a controlled manner by means of the capillary effect.

Before the body 1 is introduced into the insulation material 13, parts of the body 1 which are not intended to be covered with insulation material 13 can be covered or clamped.

After the introduction of the insulation material 13, the insulation material 13 is cured. In the case of a glass-based insulation material 13, the insulation material 13 can be fired.

During the process of introducing the insulation material 13, the body 1 can already be provided with external contact-connections 17, 18 or can be free of external contact-connections. Possible variants of the method sequence are shown in FIGS. 3 to 8.

FIGS. 3 to 5 show lateral plan views of the body from FIG. 1 in accordance with a first method sequence.

In this case, FIG. 3 shows the body 1 before the introduction of insulation material. No external contacting are applied on the side surfaces 5, 6, and so the cavities 7, 8 are exposed on both side surfaces 5, 6. The body 1 without external contactings is introduced for example into the liquid insulation material 13 as shown in FIG. 2.

Alternatively, the insulation material 13 can be applied to the side surface 5, 6, for example by screen printing. This method is particularly well suited to glass as insulation material 13. The insulation material 13 can be applied as paste to the side surfaces 5,6 and be liquefied by means of a firing process. The insulation material 13 is drawn into the cavities 7, 8 by the capillary forces. By way of example, the insulation material 13 fills only the region of the cavities 7, 8 near the side surfaces 5, 6 and does not advance as far as the electrode ends 11, 12.

FIG. 4 shows the body 1 from FIG. 3 after the introduction of the insulation material 13. The insulation zones 9, 10 here are completely filled with the insulation material 13. The insulation material 13 is cured or fired after or during introduction into the cavities 7, 8. The side surfaces 5, 6, 15, 16 can subsequently be polished in order to remove excess insulation material 13. By way of example, a polishing of the first side surface 5 removes insulation material 13 from the first electrode layers 3.

Afterward, external contactings are applied to the first and second side surfaces 5, 6.

FIG. 5 shows the body 1 after the application of external contactings 17, 18. The external contactings 17, 18 are applied for example as metal pastes to the side surfaces 5, 6 and are subsequently fired. In an alternative embodiment, the external contactings 17, 18 are applied in a sputtering method. In a further alternative embodiment, the external contactings 17, 18 can be embodied as conductive adhesive.

By way of example, a finished component 19 is now present. In an alternative embodiment, the body 1 is separated into a plurality of main bodies for components. This step can be carried out before or after the curing of the lacquer, before or after the polishing of the side surfaces 5, 6, 15, 16 or before or after the fitting of the external contact-connections 17, 18.

FIGS. 6 to 8 show lateral plan views of the body 1 from FIG. 1 in accordance with a second method sequence.

In accordance with this method sequence, external contactings 17, 18 are applied to the body 1 before the insulation material 13 is introduced. This makes it possible, in particular, to use an organic insulation material 13 in conjunction with fired external contactings 17, 18.

FIG. 6 shows the body 1 before the introduction of insulation material and before the application of external contactings.

FIG. 7 shows the body 1 after the application of external contactings 17, 18 to the opposite side surfaces 5, 6. By way of example, the external contactings 17, 18 are produced by metallization pastes which are applied to the side surfaces 17, 18 and fired.

The cavities 7, 8 are still free of insulation material, such that hollow spaces are situated below the external contactings 17, 18.

Insulation material 13 is subsequently introduced into the cavities 7, 8, as illustrated in FIG. 2. Since here the external contactings 17, 18 are already connected to the electrode layers 3, 4, it is possible to omit the step of polishing the surface after the introduction of the insulation material 13.

FIG. 8 shows the body 1 after the introduction of the insulation material 13. The insulation material 13 is cured. By way of example, a finished component 19 is now present. Alternatively, the body 1 can be separated into a plurality of main bodies for components. This step can alternatively be carried out before or after the application of the external contactings 17, 18 or before or after the introduction of the insulation material 13. The component 19 can comprise, in particular, an organic insulation material 13 and fired external contactings 17, 18.

LIST OF REFERENCE SIGNS

1 Body
2 Dielectric layer
3 First electrode layer
4 Second electrode layer
5 First side surface
6 Second side surface
7 First cavity
8 Second cavity
9 First insulation zone
10 Second insulation zone
11 First electrode end
12 Second electrode end
13 Insulation material
14 Container
15 Third side surface
16 Fourth side surface
17 First external contacting
18 Second external contacting
19 Component
S Stacking direction

The invention claimed is:

1. A method for producing an electric component comprising the following steps:
    A) providing a body having at least one cavity; and
    B) at least partly filling the cavity with an insulation material by means of capillary forces,
    wherein the body is introduced into the insulation material only by one of the side surfaces of the body and the insulation material then migrates into the cavity on account of capillary forces.

2. The method according to claim 1, wherein the cavity is etched into the body.

3. The method according to claim 1, wherein before step B) external contacting is applied to the body.

4. The method according to claim 3, wherein the external contact-connection at least partly covers the cavity.

5. The method according to claim 1, wherein after step B) external contacting is applied to the body.

6. The method according to claim 3, wherein the external contacting is fired.

7. The method according to claim 1, wherein the insulation material comprises lacquer or glass.

8. The method according to claim 1, wherein the body has at least one electrode layer and wherein the cavity adjoins the electrode layer.

9. The method according to claim 1, wherein the body has at least one electrode layer and wherein after step B) the insulation material covers at least one end of the electrode layer.

10. The method according to claim 1, wherein the cavity does not adjoin an electrode layer.

11. The method according to claim 1, wherein parts of the body are covered before step B).

12. The method according to claim 1, wherein the body is separated into a plurality of main bodies for electric components after step B).

13. The method according to claim 1, wherein the body has cavities on different side surfaces and wherein the insulation material is introduced into the cavities on the different side surfaces in a single-stage method.

14. The method according to claim 1, wherein the body is introduced at least partly into the liquid insulation material in step B).

* * * * *